United States Patent
Paek et al.

(10) Patent No.: US 11,043,464 B2
(45) Date of Patent: Jun. 22, 2021

(54) SEMICONDUCTOR DEVICE HAVING UPPER AND LOWER REDISTRIBUTION LAYERS

(71) Applicant: Amkor Technology Singapore Holding Pte. Ltd., Singapore (SG)

(72) Inventors: Jong Sik Paek, Incheon (KR); Doo Hyun Park, Seongnam-si (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 16/044,164

(22) Filed: Jul. 24, 2018

(65) Prior Publication Data

US 2018/0366432 A1 Dec. 20, 2018

Related U.S. Application Data

(63) Continuation of application No. 15/340,785, filed on Nov. 1, 2016, now Pat. No. 10,032,740, which is a
(Continued)

(30) Foreign Application Priority Data

Feb. 4, 2014 (KR) .................. 10-2014-0012762

(51) Int. Cl.
*H01L 23/00* (2006.01)
*H01L 21/56* (2006.01)
(Continued)

(52) U.S. Cl.
CPC .............. *H01L 24/17* (2013.01); *H01L 21/56* (2013.01); *H01L 21/568* (2013.01); *H01L 23/3135* (2013.01); *H01L 24/19* (2013.01);
*H01L 24/85* (2013.01); *H01L 25/105* (2013.01); *H01L 23/5389* (2013.01); *H01L 24/13* (2013.01); *H01L 24/16* (2013.01); *H01L 24/32* (2013.01);
(Continued)

(58) Field of Classification Search
None
See application file for complete search history.

(56) References Cited

U.S. PATENT DOCUMENTS 6,740,964 B2 5/2004 Sasaki
8,004,095 B2 8/2011 Shim et al.
(Continued)

FOREIGN PATENT DOCUMENTS

KR   2010-0005-3762 A   5/2010
KR   2012-009-4712 A    8/2012
KR   10-2013-0052179 A  5/2013

OTHER PUBLICATIONS

Fillion, Ray, "Advanced Packaging Technology for Leading Edge Microelectronics and Flexible Electronics", MSE 542 Cornell University, downloaded from URL on Feb. 3, 2016 (Year: 2016).*
(Continued)

*Primary Examiner* — J. E. Schoenholtz
(74) *Attorney, Agent, or Firm* — McAndrews, Held & Malloy, Ltd.

(57) ABSTRACT

A semiconductor device and manufacturing method thereof. Various aspects of the disclosure may, for example, comprise forming a back end of line layer on a dummy substrate, completing at least a first portion of an assembly, and removing the dummy substrate.

18 Claims, 4 Drawing Sheets

Related U.S. Application Data continuation of application No. 14/313,724, filed on Jun. 24, 2014, now Pat. No. 9,484,331.

(51) Int. Cl.
*H01L 25/10* (2006.01)
*H01L 23/31* (2006.01)
*H01L 23/538* (2006.01)

(52) U.S. Cl.
CPC .............. *H01L 24/48* (2013.01); *H01L 24/73* (2013.01); *H01L 24/81* (2013.01); *H01L 24/92* (2013.01); *H01L 2224/0401* (2013.01); *H01L 2224/04042* (2013.01); *H01L 2224/04105* (2013.01); *H01L 2224/12105* (2013.01); *H01L 2224/131* (2013.01); *H01L 2224/13147* (2013.01); *H01L 2224/16225* (2013.01); *H01L 2224/32225* (2013.01); *H01L 2224/45099* (2013.01); *H01L 2224/48091* (2013.01); *H01L 2224/48227* (2013.01); *H01L 2224/73204* (2013.01); *H01L 2224/73253* (2013.01); *H01L 2224/73267* (2013.01); *H01L 2224/81005* (2013.01); *H01L 2224/81203* (2013.01); *H01L 2224/81815* (2013.01); *H01L 2224/85* (2013.01); *H01L 2224/92125* (2013.01); *H01L 2225/107* (2013.01); *H01L 2225/1011* (2013.01); *H01L 2225/1023* (2013.01); *H01L 2225/1035* (2013.01); *H01L 2225/1041* (2013.01); *H01L 2225/1058* (2013.01); *H01L 2924/00012* (2013.01); *H01L 2924/00014* (2013.01); *H01L 2924/12042* (2013.01); *H01L 2924/15311* (2013.01); *H01L 2924/15331* (2013.01); *H01L 2924/181* (2013.01); *H01L 2924/18161* (2013.01); *H01L 2924/18162* (2013.01); *H01L 2924/19107* (2013.01); *H01L 2924/3511* (2013.01)

(56) References Cited

U.S. PATENT DOCUMENTS

| | | | |
|---|---|---|---|
| 9,064,718 B1 | 6/2015 | Muniandy et al. | |
| 9,484,331 B2 | 11/2016 | Paek et al. | |
| 10,163,867 B2 * | 12/2018 | Kim | H01L 25/0657 |
| 2005/0035464 A1 * | 2/2005 | Ho | H05K 3/3436 |
| | | | 257/778 |
| 2007/0069389 A1 | 3/2007 | Wollanke et al. | |
| 2009/0008765 A1 | 1/2009 | Yamano et al. | |
| 2009/0085201 A1 | 4/2009 | Mathew | |
| 2009/0140442 A1 | 6/2009 | Lin | |
| 2010/0140772 A1 | 6/2010 | Lin et al. | |
| 2011/0068427 A1 * | 3/2011 | Paek | H01L 24/82 |
| | | | 257/433 |
| 2011/0254156 A1 | 10/2011 | Lin | |
| 2012/0056329 A1 | 3/2012 | Pagaila et al. | |
| 2012/0211885 A1 | 8/2012 | Choi | |
| 2012/0268899 A1 * | 10/2012 | Haba | H01L 24/20 |
| | | | 361/728 |
| 2013/0062761 A1 | 3/2013 | Lin | |
| 2013/0113098 A1 * | 5/2013 | Hwang | H01L 23/49816 |
| | | | 257/738 |
| 2013/0168849 A1 | 7/2013 | Scanlan | |
| 2014/0091473 A1 * | 4/2014 | Len | H01L 24/05 |
| | | | 257/774 |
| 2014/0103488 A1 * | 4/2014 | Chen | H01L 24/83 |
| | | | 257/532 |
| 2014/0217604 A1 | 8/2014 | Chou | |
| 2014/0217619 A1 | 8/2014 | Zhao et al. | |
| 2014/0246779 A1 | 9/2014 | Lin et al. | |
| 2014/0264933 A1 | 9/2014 | Yu et al. | |
| 2014/0319661 A1 | 10/2014 | Pagaila | |
| 2014/0367850 A1 * | 12/2014 | Wang | H01L 23/49811 |
| | | | 257/737 |
| 2015/0044819 A1 | 2/2015 | Lin | |
| 2015/0102484 A1 * | 4/2015 | Chen | H01L 23/49833 |
| | | | 257/737 |
| 2015/0155203 A1 | 6/2015 | Chen | |
| 2015/0162220 A1 | 6/2015 | Chou | |
| 2015/0194388 A1 | 7/2015 | Pabst | |
| 2015/0221573 A1 | 8/2015 | Paek et al. | |
| 2017/0243839 A1 * | 8/2017 | Buckalew | H01L 24/20 |

OTHER PUBLICATIONS

FO-WLP, Embedded Die, and Alternatives: Market Trends and Drivers,TechSearch 2016 downloaded from URL on May 25, 2019. (Year: 2016).*

Nishitani, Y. "Coreless Packaging Technology for High Performance Applications", 62nd Electronic Components and Technology Conference, May 29-Jun. 1, 2012, San Diego CA (Year: 2012).*

Rao, Vempati Srinivasa, et al. "Process and Reliability of Large Fan-Out Wafer Level Package Based Package-on-Package." 2017 IEEE 67th Electronic Components and Technology Conference (ECTC), 2017, doi: 10.1109/ectc.2017.122. (Year: 2017).*

Of FO-WLP, Embedded Die, and Alternatives: Market Trends and Drivers, TechSearch 2016 downloaded from URL<http://www.semicontaiwan.org/en/sites/semicontaiwan.org/files/data16/docs/(4)%204.%20EmbeddedSemiconTaiwan2016.pdf> on May 25, 2019 (Year: 2016).*

Zohni, Wael (Invensas Corporation), Ultra high-bandwidth PoP infrastructure development, 4 pages, Nov.-Dec. 2013.

Invensas™ BVA PoP for Mobile Computing: Untra-High 10 withoug TSVs, 4 pages, Jun. 26, 2012.

* cited by examiner

SEMICONDUCTOR DEVICE HAVING UPPER AND LOWER REDISTRIBUTION LAYERS

CROSS-REFERENCE TO RELATED APPLICATIONS/INCORPORATION BY REFERENCE

The present application makes reference to, claims priority to, and claims the benefit of Korean Patent Application No. 10-2014-0012762, filed on Feb. 4, 2014, the contents of which are hereby incorporated herein by reference, in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present semiconductor devices and/or manufacturing methods are inadequate, for example resulting in excessively thick, warped, and expensive components. Further limitations and disadvantages of conventional and traditional approaches will become apparent to one of skill in the art, through comparison of such approaches with the various aspects of the present disclosure as set forth in the remainder of the present application with reference to the drawings.

DETAILED DESCRIPTION

Figure 1A:
FIGS. 1a to 1j show cross-sectional views of an example semiconductor device at various stages of processing, in accordance with various aspects of the disclosure.

The following discussion presents various aspects of the present disclosure by providing various examples thereof. Such examples are non-limiting, and thus the scope of various aspects of the present disclosure should not necessarily be limited by any particular characteristics of the provided examples.

As utilized herein, the phrases "for example" and "e.g." are non-limiting and are generally synonymous with "by way of example and not limitation," "for example and not limitation," and the like. Similarly, as utilized herein, the term "exemplary" means serving as a non-limiting example, instance, or illustration.

As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code.

As utilized herein, the phrases "operates to" and "is operable to" describe functionality performed by particular hardware, comprising hardware operating in accordance with software instructions. The phrases "operates to" and "is operable to" include "operates when enabled to". For example, a module that operates to perform a particular operation, but only after receiving a signal to enable such operation, is included by the phrase "operates to."

The terminology used herein is for the purpose of describing particular example embodiments only and is not intended to be limiting of the disclosure. As used herein, the singular forms are intended to include the plural forms as well, unless the context clearly indicates otherwise. It will be further understood that the terms "include," "comprise," "including," and/or "comprising," when used in this specification, specify the presence of stated features, integers, steps, operations, elements, and/or components, but do not preclude the presence or addition of one or more other features, integers, steps, operations, elements, components, and/or groups thereof. In other words, such terms are generally described as being open-ended.

It will be understood that, although the terms first, second, etc. may be used herein to describe various elements, components, regions, layers and/or sections, these elements should not be limited by these terms. These terms are only used to distinguish one element from another element, component, region, layer and/or section. Thus, for example, a first element, a first component, a first region, a first layer and/or a first section discussed below could be termed a second element, a second component, a second region, a second layer and/or a second section without departing from the teachings of the present disclosure.

Various aspects of the present disclosure provide a manufacturing method of a semiconductor device that is thin while retaining excellent electrical properties and experiences reduced warpage due to non-use of a printed circuit board (PCB), and a semiconductor device produced by such manufacturing method.

Various aspects of the present disclosure also provide a manufacturing method of a semiconductor device, which can be manufactured at a reduced cost due to non-use of a printed circuit board (PCB), and a semiconductor device produced by such manufacturing method.

In accordance with various aspects of the present invention, there is provided a manufacturing method of a semiconductor device, comprising forming a back end of line (BEOL) layer on a dummy substrate, electrically connecting a semiconductor die to the BEOL layer, firstly encapsulating the BEOL layer and the semiconductor die using a first encapsulant, removing the dummy substrate from the BEOL layer, electrically connecting a solder ball to the BEOL layer, secondly encapsulating the BEOL layer and the solder ball using a second encapsulant, and electrically connecting a semiconductor package to the BEOL layer.

The dummy substrate may, for example, comprise silicon, glass, silicon carbide, sapphire, quartz, ceramic, metal oxide or a metal. The semiconductor package may, for example, be electrically connected to the BEOL layer by a conductive pillar (e.g., formed by plating; formed with a wire, for example a free-standing wire bond wire; etc.) passing through the first encapsulant. The semiconductor die may, for example, be bonded to the BEOL layer using flip chip technology. The solder ball may, for example, be exposed to the outside through the second encapsulant.

The manufacturing method may, for example, further comprise forming a redistribution layer in the first encapsulant to be electrically connected to the BEOL layer. Here, for example, the semiconductor package may be electrically connected to the redistribution layer.

An interposer electrically connected to the BEOL layer may, for example, further be formed in the first encapsulant, and the semiconductor package may, for example, be electrically connected to the interposer.

The forming of the BEOL layer may, for example, comprise forming a dielectric layer having an opening in the dummy substrate, and forming a redistribution layer and a conductive pillar in the dielectric layer. The removing of the dummy substrate may, for example, comprise grinding the dummy substrate, and etching the dummy substrate.

In accordance with various aspects of the present invention, there may be provided a semiconductor device comprising a back end of line (BEOL) layer, a semiconductor die electrically connected to the BEOL layer, a first encapsulant that firstly encapsulates the BEOL layer and the semiconductor die, a solder ball electrically connected to the BEOL layer, a second encapsulant that secondly encapsulates the BEOL layer and the solder ball, and a semiconductor package electrically connected to the BEOL layer.

The semiconductor package may, for example, be electrically connected to the BEOL layer by a conductive pillar passing through the first encapsulant. The semiconductor die may, for example, be bonded to the BEOL layer using flip chip technology. The solder ball may, for example, be exposed to the outside through the second encapsulant.

The semiconductor device may further comprise a redistribution layer formed in the first encapsulant to be electrically connected to the BEOL layer. Here, for example, the semiconductor package may be electrically connected to the redistribution layer.

An interposer electrically connected to the BEOL layer may, for example, further be formed in the first encapsulant, and the semiconductor package may, for example, be electrically connected to the interposer. The BEOL layer may, for example, comprise a dielectric layer, and a redistribution layer and a conductive pillar formed in the dielectric layer.

As described above, in an example manufacturing method of a semiconductor device and an example semiconductor device produced by such a manufacturing method, according to various aspects of the present disclosure, since a printed circuit board (PCB) might not be used, the semiconductor device may be thin, retain excellent electrical properties, and experience reduced warpage.

In addition, in an example manufacturing method of a semiconductor device and an example semiconductor device produced by such a manufacturing method, according to various aspects of the present disclosure, since a printed circuit board (PCB) might not be used, the semiconductor device may be manufactured at a reduced cost, for example relative to a semiconductor device having a PCB.

Various aspects of the present disclosure may be best understood by reference to the following detailed description when read in conjunction with the accompanying drawings.

Hereinafter, various aspects of the present disclosure will be described with reference to FIGS. 1a to 3. Example embodiments of various aspects of the present disclosure will now be described more fully hereinafter with reference to the accompanying drawings; however, such aspects may be embodied in different forms and should not be construed as being limited by characteristics of the example embodiments set forth herein. In the drawing figures, the dimensions of layers and regions may be exaggerated and/or diminished for clarity of illustration. Like reference numerals may generally refer to like elements throughout.

FIGS. 1a to 1j show cross-sectional views of an example semiconductor device at various stages of processing, in accordance with various aspects of the disclosure. Such cross-sectional views may, for example, illustrate various aspects of an example manufacturing method of a semiconductor device in accordance with the present disclosure.

As illustrated by example, in FIG. 1a, a dummy substrate 110A may be prepared, the dummy substrate 110A comprising, for example, a substantially planar top surface and a substantially planar bottom surface. The dummy substrate 110A may, for example, comprise a material comprising silicon, low-grade silicon, glass, silicon carbide, sapphire, quartz, ceramic, metal oxide, a metal or equivalents thereof, etc., but aspects of the present disclosure are not limited thereto.

Next, an example method of forming a back end of line (BEOL) layer 110 on the dummy substrate 110A will be described. In some cases, the BEOL layer 110 may, for example, be the same with and/or comprise a redistribution layer. Layer 110 may, for example, be referred to herein as a "first redistribution layer." As illustrated in FIG. 1f, the first redistribution layer 110 may comprise an upper side 110' and a lower side 110".

Figure 1B:
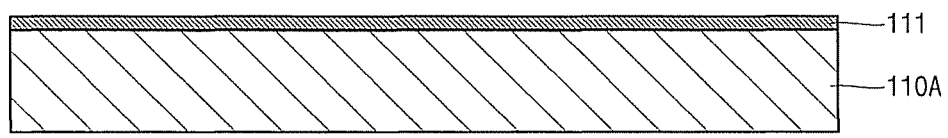

As illustrated by example in FIG. 1b, a dielectric layer 111 may be first deposited on the dummy substrate 110A (e.g., by a chemical vapor deposition (CVD) device), and an opening 111a (or one or more openings) may be formed (e.g., by a photolithography process and/or a laser process). A top surface of the dummy substrate 110A may, for example, be directly exposed to the outside by the opening 111a.

Here, for example, the dielectric layer 111 may be or comprise a material comprising a silicon oxide layer, a silicon nitride layer or equivalents thereof, etc., but aspects of the present disclosure are not limited thereto. The dielectric layer 111 may also, for example, be referred to as a "first dielectric layer."

Figure 1C:
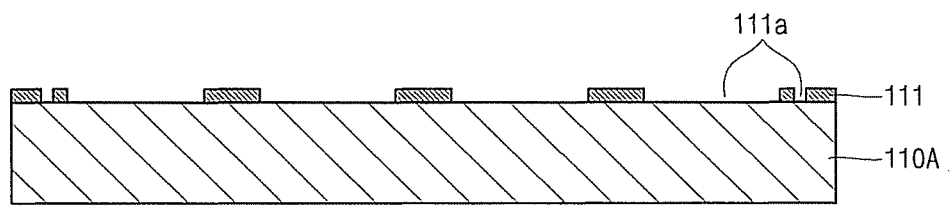

As illustrated by example in FIG. 1c, a redistribution layer 112 may be formed in the opening 11a and on the dielectric layer 111. For example, the redistribution layer 112 may be brought into direct contact with the dummy substrate 110A through the opening(s) 11a. The redistribution layer 112 may, for example, be formed by an electroless plating process for a seed layer using gold, silver, nickel, titanium and/or tungsten, an electroplating process using copper, etc., and/or a photolithography process using photoresist, but aspects of the present disclosure are not limited thereto. The redistribution layer 112 may also, for example, be referred to as a "first conductive layer."

In addition, the redistribution layer 112 may, for example, comprise copper, a copper alloy, aluminum, an aluminum alloy, iron, an iron alloy, or equivalents thereof, etc., but aspects of the present disclosure are not limited thereto.

The forming of the dielectric layer 111 and the forming of the redistribution layer 112 may, for example, be repeatedly performed multiple times, for example forming the BEOL layer 110 having a multi-layered structure.

As described above, the BEOL layer 110 might, for example, comprise only a dielectric layer and a redistribution layer but need not comprise an organic core layer or an organic build-up layer, like in a conventional PCB (e.g., a rigid PCB or a flexible PCB). Therefore, the redistribution layer may be formed thinly (e.g., to have a considerable small thickness). For example, the redistribution layer 112 may have a thickness of 10 µm or less. By contrast, a conventional PCB is generally formed to have a thickness of 200 µm to 300 µm.

In addition, as described above, since the BEOL layer 110 may be formed by a fabrication (FAB) process, the redistribution layer 112 may be formed to have a width, thickness and/or pitch in a range of 20 nm to 1000 nm.

Therefore, various aspects of the present disclosure provide a considerably fine redistribution layer 112, for example accommodating highly integrated semiconductor dies. By contrast, the redistribution layer of a conventional PCB is generally formed to have a width, thickness and/or pitch in a range of 20 µm to 30 µm.

In the BEOL layer 110, all or some regions of the redistribution layer 112 may be directly exposed to the outside. A conductive pillar 113, to be described later, may be formed on (e.g., directly on) exposed regions of the redistribution layer 112, and a semiconductor die 120 may be connected to (e.g., directly connected to) exposed regions of redistribution layer 112. As shown in FIG. 1*f*, the conductive pillar 113 may comprise a top end 113*a* and a bottom end 113*b*.

Figure 1D:
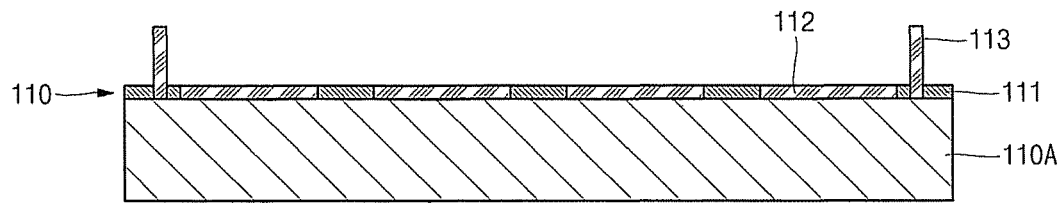

As illustrated by example in FIG. 1*d*, a conductive pillar 113 (or a plurality thereof) may be formed on (e.g., directly on) the redistribution layer 112, for example to be electrically connected to the semiconductor package 140 to be described later. Here, for example, the conductive pillar 113 may be or comprise a material comprising copper, a copper alloy, aluminum, an aluminum alloy, iron, an iron alloy, or equivalents thereof, etc., but aspects of the present disclosure are not limited thereto.

In addition, since the conductive pillar (or post) 113 may, for example, be generally formed by a general plating process, by a photolithography process, from a narrow free-standing wire (e.g., a wire-bond wire) bonded to the redistribution layer 112, etc., it may be formed to have a width smaller than approximately 50 µm. Therefore, a considerably fine conductive pillar 113 may be formed, for example compared to the conventional art. In an example, the conductive pillar 113 may allow the semiconductor package 140 to accommodate approximately 400 or more input/output terminals. In a comparative example, a solder ball formed on the conventional BEOL layer may be formed to have a diameter of approximately 200 µm or greater.

In addition, since the conductive pillar 113 may be electrically connected to the semiconductor package 140 positioned relatively far from the conductive pillar 113, the conductive pillar 113 may be formed to have a height equal to or greater than a height of the semiconductor die 120 to be described later.

In the illustrated embodiment, the conductive pillar 113 and the redistribution layer 112 are separated from each other, but they may be electrically connected to each other in practice.

Figure 1E:
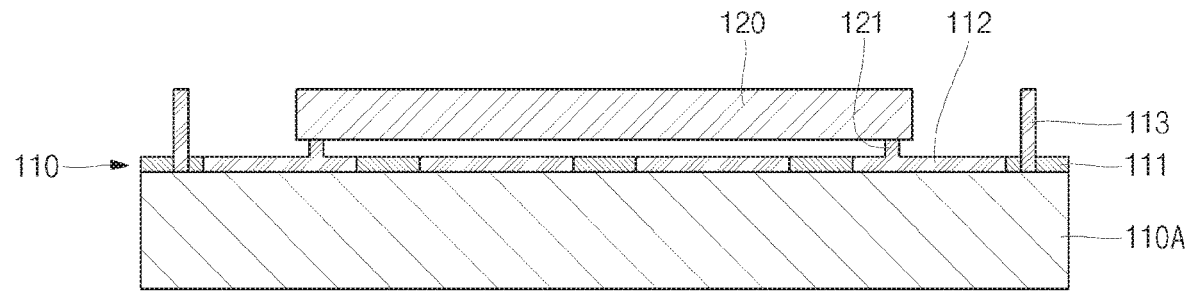
Figure 1F:
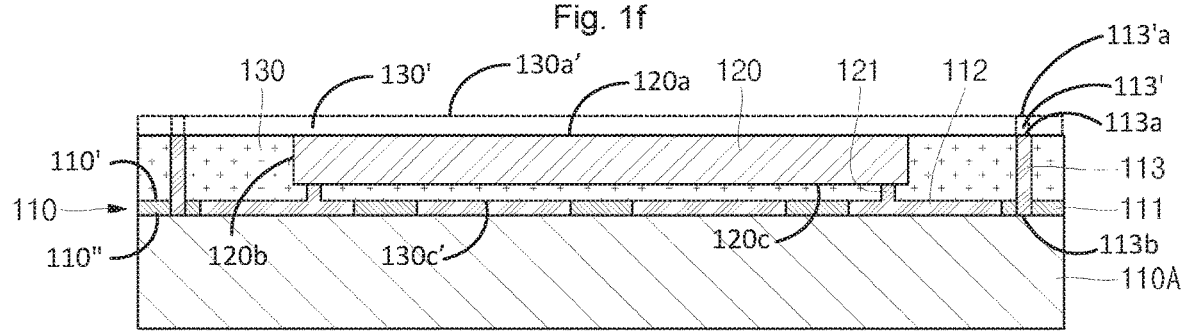

As illustrated by example in FIG. 1*e*, the semiconductor die 120 may be electrically connected to the BEOL layer 110. For example, feature 121 (e.g., a bonding pad, a copper pillar, or a bump) of the semiconductor die 120 may be electrically connected to the BEOL layer 110. In addition, the semiconductor die 120 may be electrically connected to the BEOL layer 110 using flip-chip technology.

The connection of the semiconductor die 120 may, for example, be achieved by a general thermal compression process, a mass reflow process and/or an equivalent thereof, etc., but aspects of the present disclosure are not limited thereto.

Here, for example, the semiconductor die 120 may have a thickness of approximately 50 µm to 70 µm, but aspects of the present disclosure are not limited thereto.

As discussed above, the conductive pillar 113 may have a height greater than or equal to the height of the semiconductor die 120. An example implementation in which the conductive pillar 113 has a height greater than the height of the semiconductor die 120 is shown at label 113' in FIG. 1*f*. Also for example, the top end 113'*a* of the conductive pillar 113' may be vertically higher than the upper die side 120*a* of the semiconductor die 120. In various examples, however, the height of the conductive pillar 113 may also be smaller than the height of the semiconductor die.

An underfill (not shown) may, for example, be injected into a space between the semiconductor die 120 and the BEOL layer 110, followed by curing. The underfill may, for example, make the semiconductor die 120 more stably fixed on the BEOL layer 110. Even if, for example, there is a difference in respective thermal expansion coefficients between the semiconductor die 120 and the BEOL layer 110, the semiconductor die 120 and the BEOL layer 110 are not electrically disconnected from each other.

In various examples, if the first encapsulant 130 to be described later is viscous enough to flow into a gap between the semiconductor die 120 and the BEOL layer 110, since the first encapsulant 130 may be directly filled in the gap between the semiconductor die 120 and the BEOL layer 110, the underfill might not be utilized.

As illustrated by example in FIG. 1*f*, the semiconductor die 120 and the conductive pillar 113 formed on the BEOL layer 110 may be firstly encapsulated by the first encapsulant 130. Therefore, the semiconductor die 120 and the conductive pillar 113 may be additionally protected from external surroundings. Here, the first encapsulant 130 may be brought into close contact with the BEOL layer 110 and may completely encapsulate the semiconductor die 120 or may expose a top surface of the semiconductor die 120 (e.g., with or without thinning or grinding). An example implementation in which the first encapsulant completely encapsulates the semiconductor die 120 is shown at label 130' in FIG. 1*f*, including for example covering the upper die side 120*a* of the semiconductor die 120, the lower die side 120*b* of the semiconductor die 120, and the lateral die sides 120*c* of the semiconductor die 120. In the example implementation, label 130*a'* may for example denote the upper encapsulant side of the encapsulant 130' and label 130*c'* may for example denote the lower encapsulant side of the encapsulant 130'.

The encapsulating may, for example, be achieved by a general transfer molding process, a compression process, an injection molding process and an equivalent thereof, etc., but aspects of the present disclosure are not limited thereto.

The first encapsulant 130 may, for example be or comprise a material selected from: a general epoxy, a film, a paste and equivalents thereof, etc., but aspects of the present disclosure are not limited thereto. For example, the BEOL layer 110, the semiconductor die 120 and the conductive pillar 113 may be cohesively integrated with each other by the first encapsulant 130.

After the first encapsulating, a grinding process may further be performed. In the grinding process, for example, the first encapsulant 130 and the semiconductor die 120 may be subjected to the grinding process (e.g., by or to a predetermined thickness), thereby reducing the thickness of the semiconductor device and/or encapsulant.

Figure 1G:
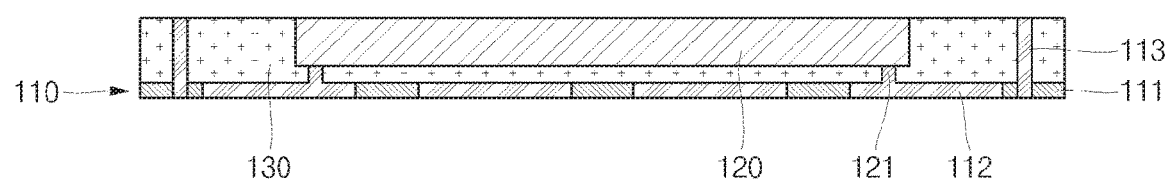

As illustrated by example in FIG. 1g, the dummy substrate 110A may be removed from the BEOL layer 110. For example, the first encapsulant 130 may be held by a wafer support system. Then, the dummy substrate 110A may be removed, for example, to a predetermined thickness through a grinding process, and then completely removed by a dry and/or wet etching process.

For example, a region (e.g., a bottom surface) of the redistribution layer 112 of the BEOL layer 110 may be exposed to the outside through the dielectric layer 111. For example, a seed layer (using, for example, gold, silver, nickel, titanium and/or tungsten) may be directly exposed to the outside through the dielectric layer 111. Preferably, gold and/or silver may be directly exposed to the outside through the dielectric layer 111 to, for example, facilitate connection with a conductive ball (e.g., a solder ball) or another semiconductor device in a subsequent process.

Figure 1H:
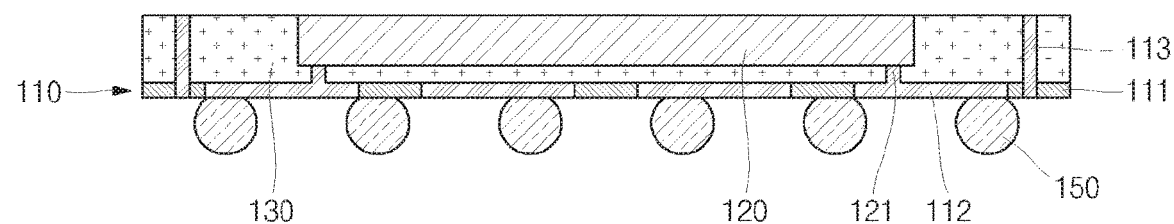

As illustrated by example in FIG. 1h, the solder ball 150 may be connected to the redistribution layer 112 exposed to the outside (e.g., the bottom) through the dielectric layer 111. For example, a volatile flux may be coated on a predetermined region of the redistribution layer 112 exposed to the outside (the bottom) through the dielectric layer 111, and the solder ball 150 may be positioned on the flux, followed by applying heating to a temperature of approximately 130° C. to 250° C., thereby making the flux volatilize and connecting the solder ball 150 to a predetermined region of the redistribution layer 112. Thereafter, a cooling process may be performed to solidify the solder ball 150 and complete the mechanically/electrically connection to the redistribution 112.

Figure 1I:
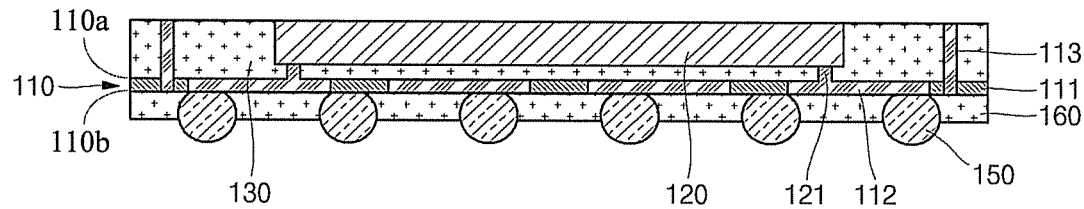

As illustrated by example in FIG. 1i, the BEOL layer 110 and the solder ball 150 may be secondly encapsulated using a second encapsulant 160. For example, the second encapsulant 160 may cover not only the dielectric layer 111 and the redistribution layer 112 of the BEOL layer 110 but also a region (a lateral region) of the solder ball 150. Here, for example, the solder ball 150 may be exposed to the outside (e.g., the bottom) through the second encapsulant 160.

In another example, after the BEOL layer 110 is secondly encapsulated using the second encapsulant 160, the solder ball 150 may be electrically connected to the BEOL layer 110, for example through and/or through openings in the second encapsulant. For example, during the second encapsulating, a region of the redistribution 112 forming the BEOL layer 110 may be exposed to the outside (e.g., the bottom).

Figure 1J:
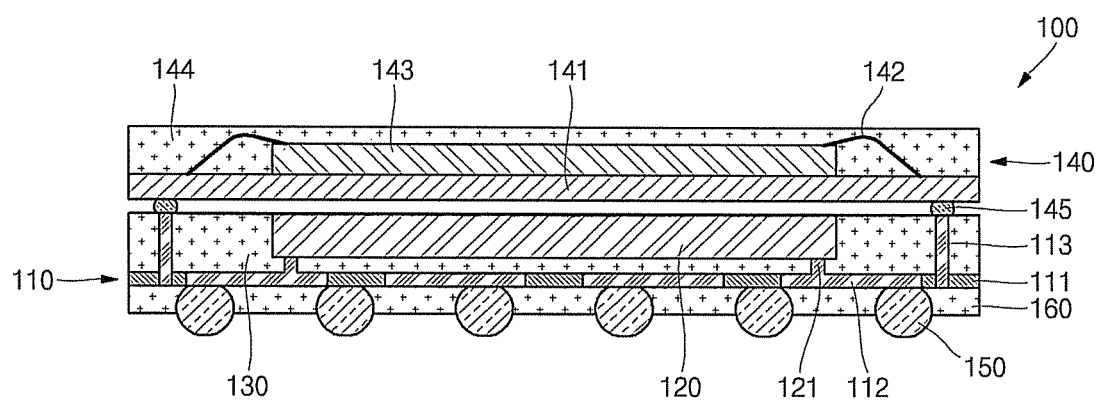

As illustrated by example in FIG. 1j, the semiconductor package 140 may be electrically connected to the BEOL layer 110. For example, the semiconductor package 140, comprising a substrate 141, a semiconductor die 143 bonded to the substrate 141 (e.g., by a conductive wire 142 or in a flip-chip configuration), and an encapsulant 144 encapsulating the substrate 141 and the semiconductor die 143, may be connected to the solder bump (or ball) 145 and the conductive pillar 113, thereby electrically connecting the semiconductor package 140 to the BEOL layer 110.

For example, the semiconductor die 120 may be an AP (processor) and the semiconductor die 143 may be an LPDDR (memory), but aspects of the present disclosure are not limited thereto.

As described above, since the conventional PCB is not used, various aspects of the present disclosure provide the semiconductor device 100 having a small thickness and excellent electrical properties while suppressing warpage. For example, the semiconductor device 100 having a thickness of approximately 100 μm to 200 μm may be provided using a BEOL layer having a thickness of approximately 10 μm or less. In addition, the semiconductor device 100 having excellent electrical properties (e.g., having a relatively small power loss and/or having relatively low susceptibility to noise) is provided by the redistribution layer having a width, thickness and/or pitch in a range of 20 nm to 30 nm. Further, since the dielectric layer included in the BEOL layer may be made of an inorganic material, it has a thermal expansion coefficient similar to (or the same as) that of each of the semiconductor die 120 and the first and second encapsulants 130 and 160, thereby providing a semiconductor device 100 that is substantially less susceptible to warpage.

In addition, since top and bottom surfaces of the BEOL layer 110 may be surrounded by the first and second encapsulants 130 and 160, the BEOL layer 110 can be protected from external surroundings.

Further, according to various aspects of the present disclosure, the BEOL layer may be formed using existing deposition equipment, plating equipment or photolithography equipment without having to purchase the conventional high-priced PCB, thereby providing the semiconductor device 100 at a reduced manufacturing cost.

The previous discussion provided a non-limiting example of a method for producing a semiconductor device, and a semiconductor device produced by such method, in accordance with various aspects of the present disclosure. Additional examples will now be provided and discussed with regard to FIG. 2 and FIG. 3.

Figure 2:
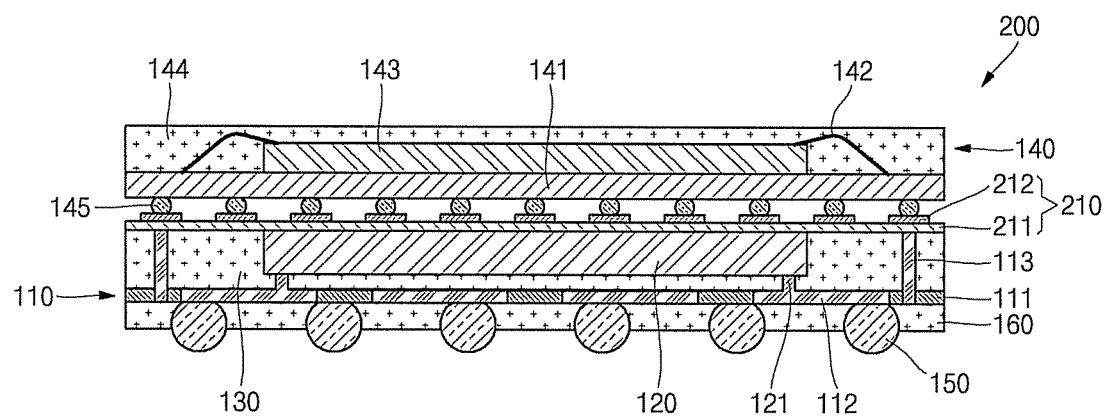
FIG. 2 shows a cross-sectional view of an example semiconductor device, in accordance with various aspects of the disclosure.

FIG. 2 shows a cross-sectional view of an example semiconductor device (200) in accordance with various aspects of the disclosure. The example semiconductor device 200 may share any or all characteristics with the example semiconductor device 100 shown in various stages in FIGS. 1a-1j.

As illustrated in FIG. 2, the semiconductor device 200 may comprise a redistribution layer 210 formed on a surface of the first encapsulant 130 to be electrically connected to the BEOL layer 110. In addition, the semiconductor package 140 may be electrically connected to the redistribution layer 210. The redistribution layer 210 may, for example, be referred to as a "second redistribution layer."

For example, the redistribution layer 210 may be electrically connected to the BEOL layer 110 through the conductive pillar 113. In addition, the redistribution layer 210 may comprise a dielectric layer 211 formed on the surface of the first encapsulant 130 using, for example, polyimide or polyamide, and a redistribution layer 212 formed on a surface of the dielectric layer 211 using, for example, copper or a copper alloy. The dielectric layer 211 may, for example, be referred to as a "second dielectric layer." The redistribution layer 212 may, for example, be referred to as a "second conductive layer."

As described above, in the illustrated example semiconductor device 200, the redistribution layer 210 may be additionally used, thereby accommodating a large number of input/output terminals in the semiconductor package 140 and placement flexibility for such terminals.

Figure 3:
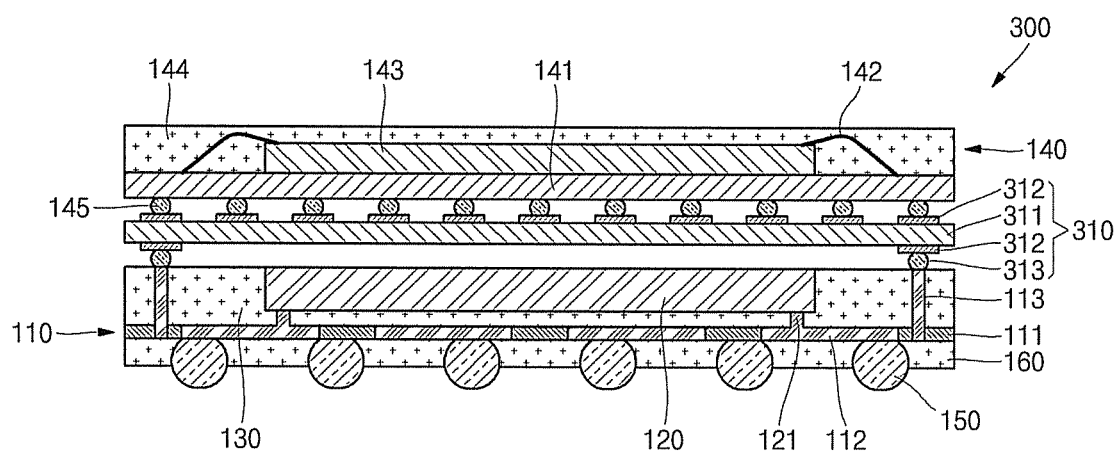
FIG. 3 shows a cross-sectional view of an example semiconductor device, in accordance with various aspects of the disclosure.

FIG. 3 shows a cross-sectional view of an example semiconductor device (300) in accordance with various aspects of the disclosure. The example semiconductor device 300 may share any or all characteristics with the example semiconductor device 100 shown in various stages in FIGS. 1a-1j and/or the example semiconductor device 200 shown in FIG. 2.

As illustrated in FIG. 3, the semiconductor device 300 may further comprise an interposer 310 (e.g., a bottom surface thereof) electrically connected to the BEOL layer 110 and positioned on the first encapsulant 130. A semiconductor package 140 may, for example, be electrically connected to a surface (e.g., a top surface) of the interposer 310.

For example, the interposer 310 may be electrically connected to the BEOL layer 110 through a conductive pillar 113. In addition, the interposer 310 may comprise a dielectric layer 311 formed on the surface of the first encapsulant 130 using, for example, silicon, polyimide or polyamide, a redistribution layer 312 formed on top and bottom surfaces of the dielectric layer 311 using, for example, copper or a copper alloy, and solder balls 313 electrically connecting the redistribution layer 312 and conductive pillars 113 to each other.

As described above, in the illustrated example semiconductor device 300, the interposer 310 is additionally used, thereby accommodating a large number of input/output terminals in the semiconductor package 140 and placement flexibility for such terminals.

This disclosure provides exemplary embodiments of various aspects of the present disclosure. The scope of the present disclosure is not limited by these example embodiments. Numerous variations, whether explicitly provided for by the specification or implied by the specification, such as variations in structure, dimension, type of material and manufacturing process, may be implemented by one skilled in the art in view of this disclosure.

In summary, various aspects of the present disclosure provide a semiconductor device and a manufacturing method thereof. While the foregoing has been described with reference to certain aspects and embodiments, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular embodiment(s) disclosed, but that the disclosure will include all embodiments falling within the scope of the appended claims.

What is claimed is:

1. A semiconductor device comprising:
a first redistribution layer comprising a first dielectric layer and a first conductive layer, wherein:
the first redistribution layer is coreless;
the first redistribution layer comprises an upper side and a lower side; and
the lower side of the first redistribution layer is free of a substrate;
a semiconductor die mounted to and electrically connected to the upper side of the first redistribution layer, where the semiconductor die comprises an upper die side that faces away from the first redistribution layer, a lower die side that faces the first redistribution layer, and a lateral die side that extends between the upper die side and the lower die side;
a conductive pillar on the upper side of the first redistribution layer, wherein at least a middle portion of the conductive pillar comprises a metal;
an encapsulant that encapsulates at least a portion of the upper side of the first redistribution layer, at least a portion of the conductive pillar, and at least a portion of the semiconductor die, wherein:
the encapsulant comprises an upper encapsulant side facing away from the first redistribution layer and a lower encapsulant side facing toward the first redistribution layer; and
the encapsulant covers the upper die side; and
a second redistribution layer on the upper encapsulant side, where the second redistribution layer comprises a second dielectric layer and a second conductive layer that is electrically connected to the first conductive layer of the first redistribution layer through the conductive pillar,
wherein the conductive pillar comprises a wire-bond wire that is at least as high as an upper side of the semiconductor die.

2. The semiconductor device of claim 1, wherein the wire-bond wire is higher than the upper side of the semiconductor die.

3. The semiconductor device of claim 1, wherein the semiconductor die is soldered to the first redistribution layer.

4. The semiconductor device of claim 1, comprising an underfill material, different from the encapsulant, directly vertically between the semiconductor die and the first redistribution layer.

5. The semiconductor device of claim 1, comprising:
a conductive bump positioned at the lower die side, where the conductive bump electrically connects the semiconductor die to the first conductive layer of the first redistribution layer; and
a plurality of metallic balls comprising solder and coupled to the lower side of the first redistribution layer.

6. The semiconductor device of claim 1, wherein at least a portion of the first conductive layer is laterally surrounded by the first dielectric layer.

7. The semiconductor device of claim 1, wherein:
the first redistribution layer is different from a printed circuit board (PCB); and
the first conductive layer comprises a plurality of traces at a pitch that is no greater than one micrometer.

8. A semiconductor device comprising:
a first redistribution layer comprising a first dielectric layer and a first conductive layer;
a semiconductor die mounted to and electrically connected to an upper side of the first redistribution layer, wherein the semiconductor die comprises a bump on a lower die side of the semiconductor die and on the upper side of the first redistribution layer, where the bump electrically connects the semiconductor die to the first conductive layer of the first redistribution layer;
a conductive pillar on the upper side of the first redistribution layer, wherein a bottom end of the conductive pillar faces and is electrically connected to the first conductive layer, and the bottom end of the conductive pillar is vertically lower than the bump;
an encapsulant that encapsulates the upper side of the first redistribution layer, the conductive pillar, and the semiconductor die, where the encapsulant comprises an upper encapsulant side facing away from the first redistribution layer and a lower encapsulant side facing toward the first redistribution layer;

a second redistribution layer on the upper encapsulant side, where the second redistribution layer comprises a second dielectric layer and a second conductive layer that is electrically connected to the first conductive layer of the first redistribution layer through the conductive pillar; and
a plurality of metallic balls comprising solder and coupled to a lower side of the first redistribution layer.

9. A semiconductor device comprising:
a first redistribution layer comprising a first dielectric layer and a first conductive layer;
a semiconductor die mounted to and electrically connected to an upper side of the first redistribution layer, wherein the semiconductor die comprises a bump on a lower die side of the semiconductor die and on the upper side of the first redistribution layer, where the bump electrically connects the semiconductor die to the first conductive layer of the first redistribution layer;
a conductive pillar on the upper side of the first redistribution layer, wherein a bottom end of the conductive pillar faces and is electrically connected to the first conductive layer, and the bottom end of the conductive pillar is vertically lower than a die bonding pad;
an encapsulant that encapsulates the upper side of the first redistribution layer, the conductive pillar, and the semiconductor die, where the encapsulant comprises an upper encapsulant side facing away from the first redistribution layer and a lower encapsulant side facing toward the first redistribution layer;
a second redistribution layer on the upper encapsulant side, where the second redistribution layer comprises a second dielectric layer and a second conductive layer that is electrically connected to the first conductive layer of the first redistribution layer through the conductive pillar; and
a plurality of metallic balls comprising solder and coupled to a lower side of the first redistribution layer,
wherein the conductive pillar comprises a bond wire.

10. The semiconductor device of claim 8, wherein the semiconductor die is soldered to the first redistribution layer.

11. The semiconductor device of claim 8, wherein a metal of the conductive pillar extends vertically upward from the first conductive layer, through a center of the conductive pillar, to a position that is at least as high as an upper side of the semiconductor die.

12. A semiconductor device comprising:
a first redistribution layer comprising a first dielectric layer and a first conductive layer;
a semiconductor die mounted to and electrically connected to an upper side of the first redistribution layer, wherein the semiconductor die comprises a bump on a lower die side of the semiconductor die and on the upper side of the first redistribution layer, where the bump electrically connects the semiconductor die to the first conductive layer of the first redistribution layer;
a conductive pillar on the upper side of the first redistribution layer, wherein a bottom end of the conductive pillar faces and is electrically connected to the first conductive layer, and the bottom end of the conductive pillar is vertically lower than a die bonding pad;
an encapsulant that encapsulates the upper side of the first redistribution layer, the conductive pillar, and the semiconductor die, where the encapsulant comprises an upper encapsulant side facing away from the first redistribution layer and a lower encapsulant side facing toward the first redistribution layer;
a second redistribution layer on the upper encapsulant side, where the second redistribution layer comprises a second dielectric layer and a second conductive layer that is electrically connected to the first conductive layer of the first redistribution layer through the conductive pillar;
a plurality of metallic balls comprising solder and coupled to a lower side of the first redistribution layer; and
an underfill material, different from the encapsulant, directly vertically between the semiconductor die and the first redistribution layer.

13. The semiconductor device of claim 8, wherein at least a portion of the first conductive layer is laterally surrounded by the first dielectric layer.

14. A semiconductor device comprising:
a first redistribution layer comprising a first dielectric layer and a first conductive layer;
a semiconductor die mounted to and electrically connected to an upper side of the first redistribution layer, the semiconductor die comprising a pad on a lower side of the semiconductor die and electrically connected to the upper side of the first redistribution layer, where the lower side of the semiconductor die faces the upper side of the first redistribution layer;
a lower encapsulant that covers a lower side of the first dielectric layer;
a metallic ball comprising solder and coupled to a lower side of the first redistribution layer, wherein the metallic ball is partially embedded within the lower encapsulant, such that a portion of the metallic ball extends downward lower than a lower side of the lower encapsulant;
a conductive pillar on the upper side of the first redistribution layer, wherein the conductive pillar is taller from the first redistribution layer than the semiconductor die;
an upper encapsulant that encapsulates the upper side of the first redistribution layer, the conductive pillar, and the semiconductor die, where the upper encapsulant comprises an upper encapsulant side facing away from the first redistribution layer and a lower encapsulant side facing toward the first redistribution layer;
a second redistribution layer on the upper encapsulant side, where the second redistribution layer comprises a second dielectric layer and a second conductive layer that is electrically connected to the first conductive layer of the first redistribution layer through the conductive pillar; and
an underfill material, different from the encapsulant, directly vertically between the semiconductor die and the first redistribution layer.

15. The semiconductor device of claim 14, wherein the lower encapsulant comprises a thermal expansion coefficient, and the first dielectric layer comprises a thermal expansion coefficient that is the same as the thermal expansion coefficient of the lower encapsulant.

16. The semiconductor device of claim 14, wherein a metal of the conductive pillar extends vertically upward from the first conductive layer, through a center of the conductive pillar, to a position that is at least as high as an upper side of the semiconductor die.

17. The semiconductor device of claim 14, wherein the conductive pillar is plated directly on the first conductive layer of the first redistribution layer.

18. The semiconductor device of claim 14, wherein at least a portion of the first conductive layer is laterally surrounded by the first dielectric layer.

* * * * *